(12) United States Patent
Paulman et al.

(10) Patent No.: US 8,430,963 B2
(45) Date of Patent: Apr. 30, 2013

(54) COOL-DOWN SYSTEM AND METHOD FOR A VAPOR DEPOSITION SYSTEM

(75) Inventors: Jason Scott Paulman, Denver, CO (US); Russell Weldon Black, Longmont, CO (US); Mark Jeffrey Pavol, Arvada, CO (US)

(73) Assignee: Primestar Solar, Inc., Arvada, CO (US)

( * ) Notice: Subject to any disclaimer, the term of this patent is extended or adjusted under 35 U.S.C. 154(b) by 314 days.

(21) Appl. No.: 12/683,807

(22) Filed: Jan. 7, 2010

(65) Prior Publication Data
US 2011/0165325 A1 Jul. 7, 2011

(51) Int. Cl.
*C23C 16/00* (2006.01)

(52) U.S. Cl.
USPC ...... 118/719; 118/724; 118/726; 156/345.27; 156/345.37; 427/255.5

(58) Field of Classification Search .................. 118/719, 118/724–726; 156/345.27, 345.37
See application file for complete search history.

(56) References Cited

U.S. PATENT DOCUMENTS

| | | | |
|---|---|---|---|
| 3,366,163 A | 1/1968 | Scharbrough | |
| 4,582,301 A * | 4/1986 | Wunning | 266/87 |
| 5,248,349 A | 9/1993 | Foote et al. | |
| 5,267,257 A | 11/1993 | Jhawar et al. | |
| 5,616,264 A * | 4/1997 | Nishi et al. | 219/494 |
| 5,712,187 A | 1/1998 | Li et al. | |
| 6,037,241 A * | 3/2000 | Powell et al. | 438/479 |
| 6,423,565 B1 | 7/2002 | Barth et al. | |
| 6,719,848 B2 | 4/2004 | Faykosh et al. | |
| 6,756,566 B2 * | 6/2004 | Moller | 219/400 |
| 2007/0272155 A1 * | 11/2007 | Nozawa et al. | 118/725 |

* cited by examiner

*Primary Examiner* — Karla Moore
(74) *Attorney, Agent, or Firm* — Dority & Manning, P.A.

(57) ABSTRACT

A system for vapor deposition of a thin film layer on photovoltaic (PV) module substrates includes a system for cool-down of the vacuum chamber through which substrates are conveyed in a vapor deposition process. The cool-down system is configured with the vacuum chamber to recirculate a cooling gas through the vacuum chamber and through an external heat exchanger in a closed cool-down loop. An associated method for forced cool-down of the vacuum chamber is also provided.

8 Claims, 3 Drawing Sheets

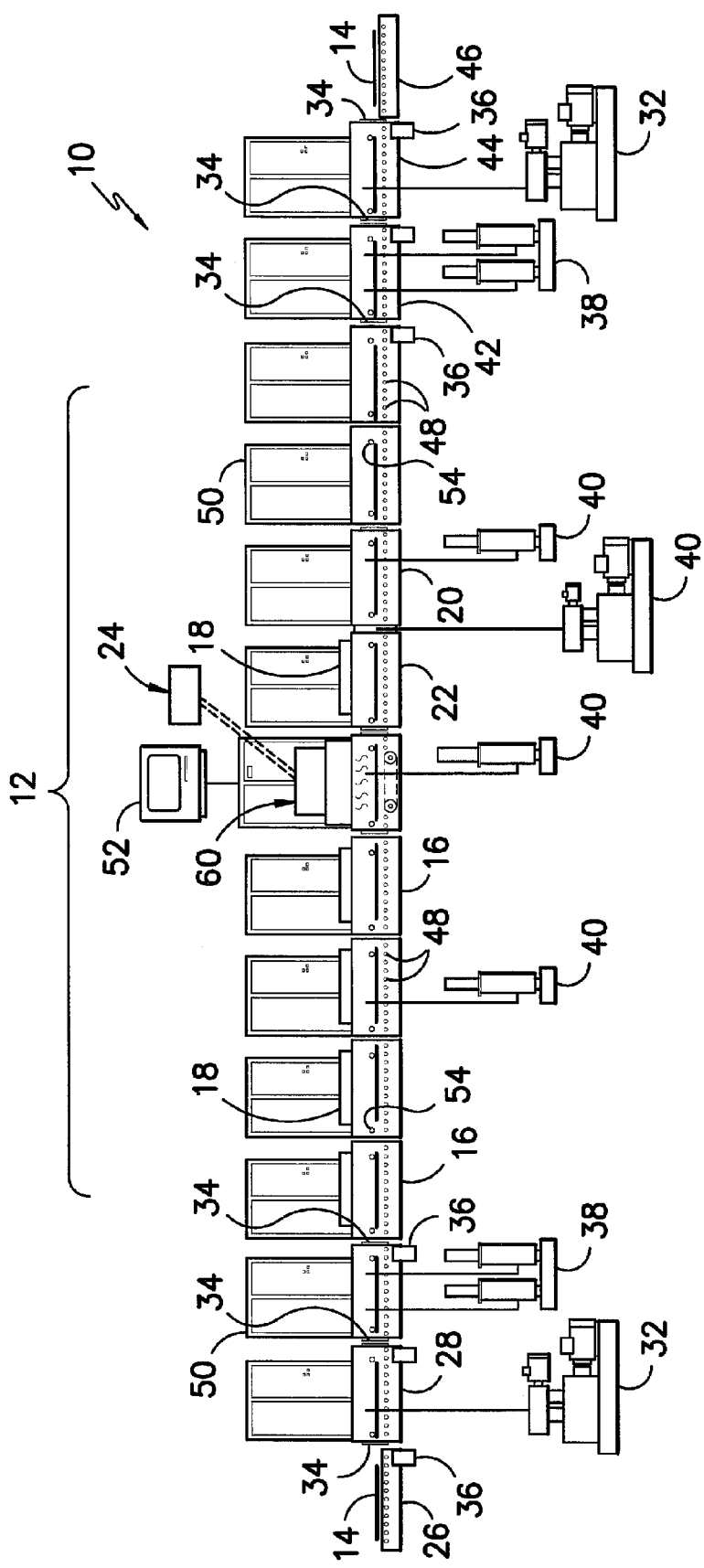
FIG. -1-

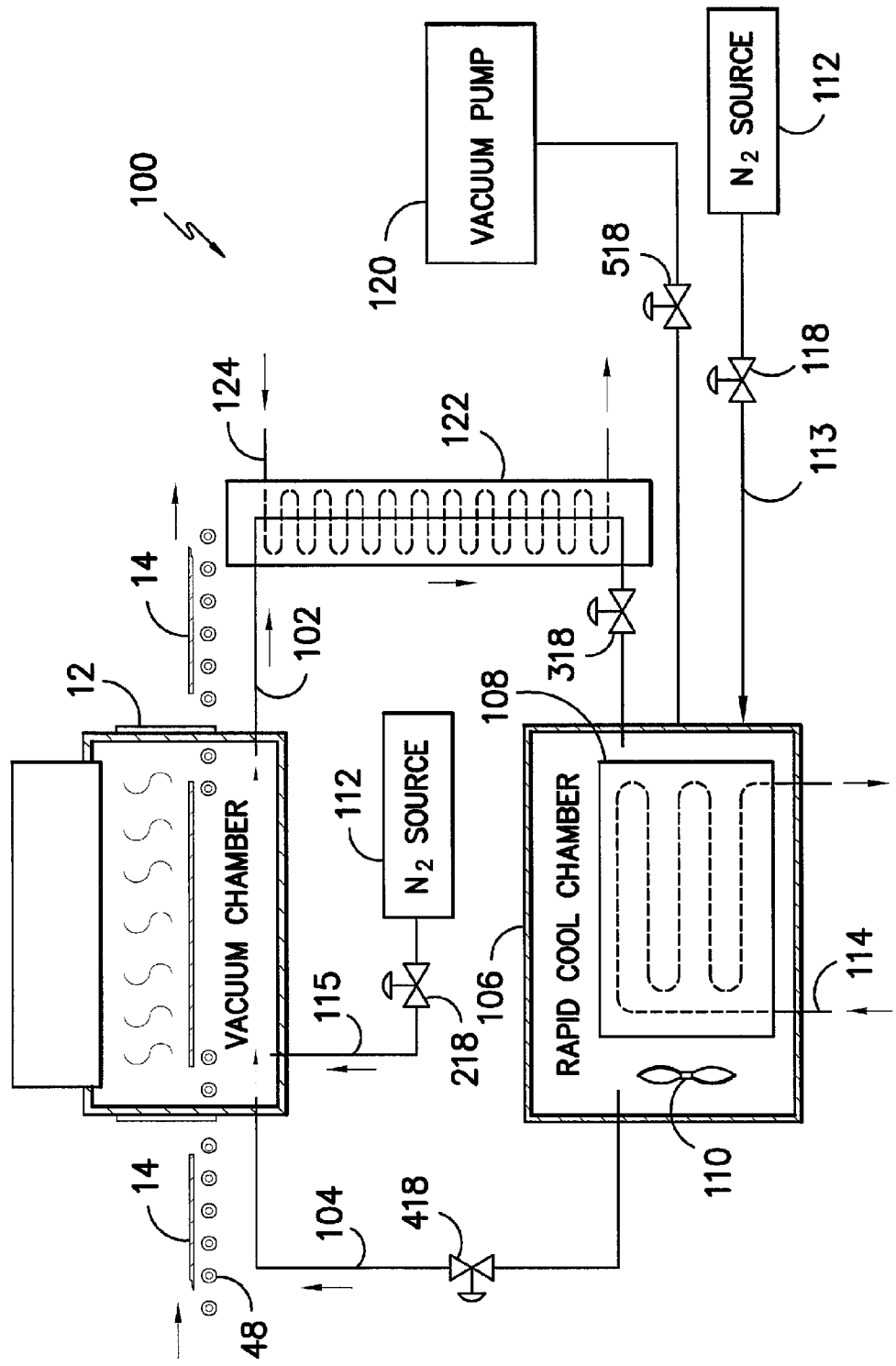
FIG. -2-

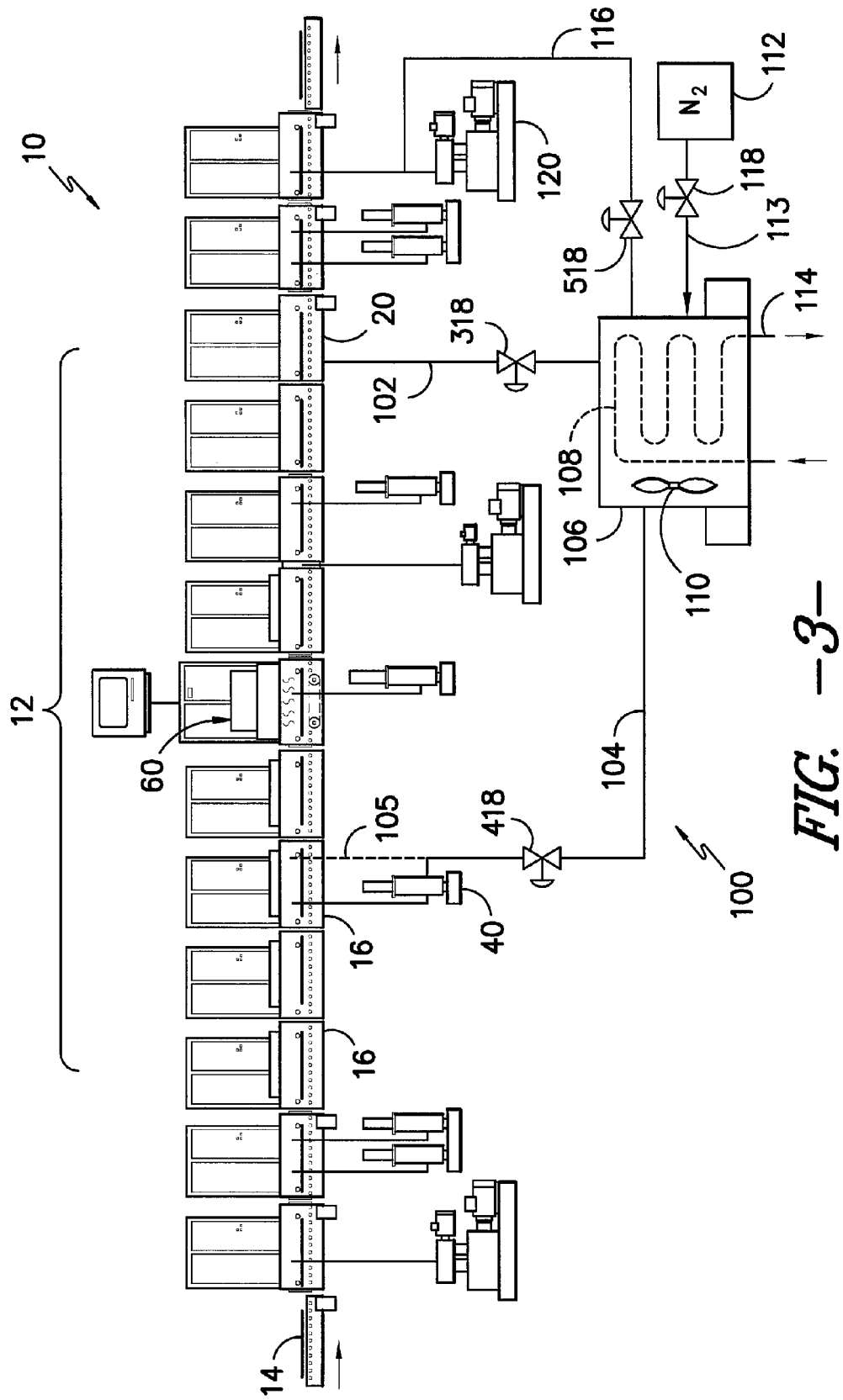
FIG. -3-

COOL-DOWN SYSTEM AND METHOD FOR A VAPOR DEPOSITION SYSTEM

FIELD OF THE INVENTION

The subject matter disclosed herein relates generally to the field of vapor deposition systems used to deposit a thin film layer, such as a semiconductor layer, on a substrate. More particularly, the subject matter is related to a system and method for rapid cool down of a vapor deposition system for maintenance or other procedures.

BACKGROUND OF THE INVENTION

Solar energy systems are gaining wide acceptance as a supplemental or primary source of electrical power in industry and residential applications. The efficiencies of the thin film photovoltaic (PV) modules used in solar energy systems are reaching a level wherein large scale production is becoming economically feasible in terms of cost per watt of power generated. This is particularly true for cadmium telluride (CdTe) based PV modules. CdTe is a semiconductor material having characteristics particularly suited for conversion of solar energy to electricity. For example, CdTe has an energy bandgap of 1.45 eV, which enables it to convert more energy from the solar spectrum as compared to lower bandgap (1.2 eV) semiconductor materials historically used in solar cell applications. Also, CdTe converts energy in lower or diffuse light conditions as compared to the lower bandgap materials and, thus, has a longer effective conversion time over the course of a day or in low-light (e.g., cloudy) conditions as compared to other conventional materials.

However, the advantages of CdTe not withstanding, sustainable commercial exploitation and acceptance of solar power depends on the ability to produce efficient PV modules on a large production scale in a cost effective manner. The ability to process relatively large surface area substrates in a vapor deposition system with minimal interruptions is a crucial consideration in this regard.

All vapor deposition systems, such as CSS (Closed System Sublimation) systems, inevitably require shut-down for scheduled maintenance, repairs, and other procedures. However, the systems must be cooled from extremely high operating temperatures (in excess of 500° C.) and very low pressures (mTorr range) prior to any such procedures being performed. For example, temperature must be reduced at a controlled rate to below about 400° C. before any of the graphite components in the system are exposed to oxygen, or such components may ignite.

The cool-down of conventional vapor deposition systems typically involves backfilling the vacuum chamber portion of the system with an inert gas, such as nitrogen. The gas provides a conductive medium and the system is allowed to cool by simple convection. This process is disadvantageous in that it takes an inordinately long time for the system components to cool. Down-times of about 4 hours for cooling conventional systems from operational temperatures and pressure to a temperature suitable for manual handling of the components are typical. The system is not producing PV modules during this time and, thus, down-time directly attributable to the cool-down process can add considerably to the overall manufacturing costs.

Vacuum furnaces are widely used in the metal fabrication industry for heating materials, typically metals, to very high temperatures (1100° C. to 1500° C.) to carry out processes such as brazing, sintering, and heat treatment with good consistency and low contamination. Reference is made, for example, to the vacuum furnaces produced by G-M Enterprises of Corona, Calif., USA. Vacuum furnaces typically utilize a quench system to rapidly cool the metal work pieces after the desired process in complete. The quench system recirculates a pressurized inert gas, typically argon, through a heat exchanger and to nozzles in the furnace directed towards the work pieces until a desired temperature of the work pieces is reached, at which time the work piece is removed from the furnace. Reference is made, for example, to U.S. Pat. No. 5,267,257. These quenching systems are not, however, suited for cool-down of an entire vapor deposition system.

Accordingly, there exists an ongoing need in the PV module industry for an improved system and method for efficient cool-down of a vapor deposition system.

BRIEF DESCRIPTION OF THE INVENTION

Aspects and advantages of the invention will be set forth in part in the following description, or may be obvious from the description, or may be learned through practice of the invention.

In accordance with an embodiment of the invention, a system is provided for vapor deposition of a thin film layer on photovoltaic (PV) module substrates. The system includes a vacuum chamber through which substrates are conveyed in a vapor deposition process wherein a source material is sublimated and deposited onto a surface of the substrates. For maintenance or other procedures requiring shut-down of the vapor deposition system, a cool-down system is configured with the vacuum chamber to recirculate a cooling gas through said vacuum chamber and through an external heat exchanger in a closed cool-down loop. The cooling gas removes heat from the vacuum chamber and transfers the heat in the heat exchanger.

In a particular embodiment, the cool-down system includes an intake duct connected at a first location to the vacuum chamber. A supply duct is connected at a second location to the vacuum chamber that is spaced from the first location. An external cool-down chamber is provided, with the intake duct and the supply duct connected to the cool-down chamber. The heat exchanger and a blower are disposed within the cool-down chamber. An inert gas supply is configured to introduce the cooling gas into the closed loop cool-down system. In operation of the cool-down system, the cooling gas is drawn through the vacuum chamber, cooled in the cool-down chamber, and recirculated back through the vacuum chamber in the closed cool-down loop.

Variations and modifications to the embodiments of the vapor deposition system discussed above are within the scope and spirit of the invention and may be further described herein.

In still another embodiment of the invention, a method is provided for cool-down of a vacuum chamber in a vapor deposition system wherein a thin film layer of a source material is deposited onto photovoltaic (PV) module substrates. The vapor deposition system has a cool-down system configured in fluid communication with the vacuum chamber. The method includes isolating the cool-down system from the vacuum chamber and evacuating the isolated cool-down system to remove oxygen therefrom. The system is then unisolated and defines a closed cool-down loop that includes the vacuum chamber. An inert gas is introduced into the cool-down loop and is recirculated through the vacuum chamber and a heat exchanger in the cool-down loop so as to cool the vacuum chamber.

Variations and modifications to the embodiment of the cool-down method discussed above are within the scope and spirit of the invention and may be further described herein.

BRIEF DESCRIPTION OF THE DRAWING

A full and enabling disclosure of the present invention, including the best mode thereof, is set forth in the specification, which makes reference to the appended drawings, in which:

FIG. 1 is a plan view of a vapor deposition system that may incorporate embodiments of the cool-down system and method of the present invention;

FIG. 2 is a diagram view of an embodiment of a cool-down system for a vapor deposition chamber in accordance with aspects of the invention; and, FIG. 3 is a plan view of the system of FIG. 1 incorporating an embodiment of a cool-down system in accordance with aspects of the invention.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment, can be used with another embodiment to yield a still further embodiment. Thus, it is intended that the present invention encompass such modifications and variations as come within the scope of the appended claims and their equivalents.

FIG. 1 illustrates an embodiment of a vapor deposition system 10 that may incorporate a vapor deposition chamber cool-down apparatus (FIGS. 2 and 3) in accordance with aspects of the invention. The system 10 is configured for deposition of a thin film layer on a photovoltaic (PV) module substrate 14 (referred to hereafter as "substrate"). The thin film may be, for example, a film layer of cadmium telluride (CdTe). As mentioned, it is generally recognized in the art that a "thin" film layer on a PV module substrate is generally less than about 10 microns ($\mu m$). It should be appreciated that the present cool-down system and process is not limited to use in the system 10 illustrated in FIG. 1, but may be incorporated into any suitable processing line configured for vapor deposition of a thin film layer onto a PV module substrate 14.

For reference and an understanding of an environment in which the present cool-down system and process may be used, the system 10 of FIG. 1 is described below, followed by a detailed description of the cool-down system and related method.

Referring to FIG. 1, the exemplary system 10 includes a vacuum chamber 12 that, in a particular embodiment, may be defined by a plurality of interconnected modules. For example, a plurality of interconnected heater modules 16 define a pre-heat section of the vacuum chamber 12 through which the substrates 14 are conveyed and heated to a desired temperature before being conveyed into a vapor deposition apparatus 60 (which may also be a module). Each of the pre-heat modules 16 includes an independently controlled heater unit 18 configured therewith.

The vacuum chamber 12 also includes a plurality of interconnected cool-down modules 20 within the vacuum chamber 12 downstream of the vapor deposition apparatus 60. The cool-down modules 20 define a cool-down section within the vacuum chamber 12 in which the substrates 14 having the thin film of sublimed source material deposited thereon are cooled at a controlled cool-down rate prior to the substrates 14 being removed from the system 10. Each of the modules 20 may include a forced cooling system wherein a cooling medium, such as chilled water, refrigerant, or other medium is pumped through cooling coils configured with the modules 20.

In the illustrated embodiment of system 10, at least one post-heat module 22 is located immediately downstream of the vapor deposition apparatus 60 and before the cool-down modules 20. As the leading section of a substrate 14 is conveyed out of the vapor deposition apparatus 60, it moves into the post-heat module 22, which maintains the temperature of the substrate 14 at essentially the same temperature as the remaining portion of the substrate 14 within the vapor deposition apparatus 60. In this way, leading sections of the substrate 14 are not allowed to cool while trailing sections of the substrate 14 are still within the vapor deposition apparatus 60. If the leading section of a substrate 14 were allowed to cool as it exited the apparatus 60, a non-uniform temperature would be generated longitudinally along the substrate 14. This condition could result in uneven deposition of the thin film layer, or defects in the layer.

As diagrammatically illustrated in FIG. 1, a feed device 24 is configured with the vapor deposition apparatus 60 to supply source material, such as granular CdTe. Preferably, the feed device 24 is configured so as to supply the source material without interrupting the continuous vapor deposition process within the apparatus 60 or conveyance of the substrates 14 through the apparatus 60.

Still referring to FIG. 1, the individual substrates 14 are initially placed onto a load conveyor 26, and are subsequently moved into an entry vacuum lock station that includes a load module 28 and a buffer module 30. A "rough" (initial) vacuum pump 32 is configured with the load module 28 to drawn an initial vacuum, and a "fine" (high) vacuum pump 38 is configured with the buffer module 30 to increase the vacuum in the buffer module 30 to essentially the vacuum in the vacuum chamber 12. Valves 34 (e.g., gate-type slit valves or rotary-type flapper valves) are operably disposed between the load conveyor 26 and the load module 28, between the load module 28 and the buffer module 30, and between the buffer module 30 and the vacuum chamber 12. These valves 34 are sequentially actuated by a motor or other type of actuating mechanism 36 in order to introduce the substrates 14 into the vacuum chamber 12 in a step-wise manner without affecting the vacuum within the chamber 12.

An exit vacuum lock station is configured downstream of the last cool-down module 20, and operates essentially in reverse of the entry vacuum lock station described above. For example, the exit vacuum lock station may include an exit buffer module 42 and a downstream exit lock module 44. Sequentially operated slide valves 34 are disposed between the buffer module 42 and the last one of the cool-down modules 20, between the buffer module 42 and the exit lock module 44, and between the exit lock module 44 and an exit conveyor 46. A fine vacuum pump 38 is configured with the exit buffer module 42, and a rough vacuum pump 32 is configured with the exit lock module 44. The pumps 32, 38 and valves 34 are sequentially operated to move the substrates 14 out of the vacuum chamber 12 in a step-wise fashion without loss of vacuum condition within the vacuum chamber 12.

System 10 also includes a conveyor system configured to move the substrates 14 into, through, and out of the vacuum chamber 12. In the illustrated embodiment, this conveyor system includes a plurality of individually controlled conveyors 48, with each of the various modules including one of the conveyors 48. It should be appreciated that the type or configuration of the conveyors 48 may vary. In the illustrated embodiment, the conveyors 48 are roller conveyors having rotatably driven rollers that are controlled so as to achieve a desired conveyance rate of the substrates 14 through the respective module and the system 10 overall.

As described, each of the various modules and respective conveyors in the system 10 are independently controlled to perform a particular function. For such control, each of the individual modules may have an associated independent controller 50 configured therewith to control the individual functions of the respective module. The plurality of controllers 50 may, in turn, be in communication with a central system controller 52, as illustrated in FIG. 1. The central system controller 52 can monitor and control (via the independent controllers 50) the functions of any one of the modules so as to achieve an overall desired heat-up rate, deposition rate, cool-down rate, conveyance rate, and so forth, in processing of the substrates 14 through the system 10.

Referring to FIG. 1, for independent control of the individual respective conveyors 48, each of the modules may include any manner of active or passive sensor 54 that detects the presence of the substrates 14 as they are conveyed through the module. The sensors 54 are in communication with the respective module controller 50, which is in turn in communication with the central controller 52. In this manner, the individual respective conveyor 48 may be controlled to ensure that a proper spacing between the substrates 14 is maintained and that the substrates 14 are conveyed at the desired constant conveyance rate through the vacuum chamber 12.

The vapor deposition apparatus 60 may take on various configurations and operating principles within the scope and spirit of the invention, and is generally configured for vapor deposition of a sublimated source material, such as CdTe, as a thin film on the PV module substrates 14. In the embodiment of the system 10 illustrated in FIG. 1, the apparatus 60 is an independent module and may operate in accordance with any conventional deposition process. In a particular embodiment, the apparatus 60 may include a receptacle disposed in a head chamber for receipt of granular source material from feed system 24. The receptacle is heated to a temperature effective for sublimating the source material, which flows out of the receptacle and downward through distribution components and is deposited as a thin film layer onto an upper surface of the substrates 14 conveyed through the apparatus 60.

FIG. 2 is a diagrammatic view of an embodiment of a cool-down system 100 that incorporates aspects of the invention. The system 100 is configured with the vacuum chamber 12 (FIG. 1) through which substrates 14 are conveyed by a conveyor 48. As discussed above, a vapor deposition apparatus 60 (FIG. 1) sublimates a source material and deposits the material in the form of a thin film layer on the upper surface of the substrates 14. At times, it will be necessary to shut down the vapor deposition system to gain access to the vacuum chamber 12. The cool-down system 100 is placed into operation in order to cool down the vacuum chamber 12 in a controlled and effective manner by re-circulating a cooling medium, such as an inert gas (e.g., nitrogen), through at least a section of the vacuum chamber 12 and through an external heat exchanger 108 in a closed cool-down loop. In a particular embodiment illustrated in the figures, the closed loop is defined by a circulation path through the vapor deposition apparatus wherein the cooling gas removes heat from the apparatus, and through the heat exchanger 108 wherein heat is removed from the cooling gas and transferred to a cooling medium 114, such as chilled water, refrigerant, gas, or the like.

In a particular embodiment of the cool-down system 100, an intake duct 102 is connected to the vacuum chamber 12 at a first location. The vacuum chamber 12 is depicted in FIG. 2 as a single component that includes a vapor deposition apparatus for illustrative purposes only. It should be appreciated that the vacuum chamber 12 may include any configuration of multiple components, as illustrated in FIGS. 1 and 3. A supply duct 104 is connected to the vacuum chamber 12 at a second location that is spaced from the first location. The first and second locations are selected so as to establish a cooling flow path through the vacuum chamber 12, for example from one end of the chamber 12 to the other end thereof.

An external cool-down chamber 106 is provided, with the intake duct 102 and supply duct 104 connected to the chamber 106. The chamber 106 essentially defines an enclosed air chamber in which the heat exchanger 108 and a blower or fan 110 is located. The intake duct 102 transports the heated cooling gas from the vacuum chamber 12 into the interior space of the chamber 106, wherein the heated gas flows through the heat exchanger 108 and is cooled. The blower 110 is the motive force for drawing the cooling gas from the vacuum chamber 12 and through the heat exchanger 108, and for circulating the cooled gas back to the vacuum chamber 12 through the supply duct 104.

The inert gas, for example nitrogen, is supplied into the closed loop of the cool-down system 100 from any suitable source 112. The gas may be introduced into the system at various locations. For example, referring to FIG. 2, the gas may be supplied through a line 113 directly into the cool down chamber 106 through an appropriate isolation valve 118. In an alternative configuration illustrated in FIG. 2, the inert cooling gas may be introduced into the vacuum deposition chamber 112 through a supply line 115 and an appropriate isolation valve 218.

Still referring to FIG. 2, isolation valves 318, 418 are provided in the intake duct 102 and supply duct 104. It should be appreciated that, under normal operating conditions of the vacuum chamber 12, the cool-down system 100 is isolated from the chamber 12 by way of these isolation valves. Upon shut down of the vacuum chamber 12 for cool-down, the cool-down system 100 is placed into operation by opening the isolation valves 318, 418. At this point, the ducts 102, 104 and cool-down chamber 106 are at the same vacuum pressure as the chamber 12. Introduction of the cooling gas, such as nitrogen, will pressurize the closed cooling loop to some degree, for example up to a pressure not exceeding about 1 bar. In this regard, the blower 110 should be suitable for operation in a relatively low pressure or vacuum environment.

A vacuum pump 120 is configured with the cool-down chamber 106 through an isolation valve 518. The vacuum pump 120 may be a dedicated pump used solely to evacuate the chamber 106 and ducts 102, 104 prior to placing the system 100 into operation so as to remove any oxygen from the system. As discussed above, oxygen should not be introduced into the vacuum chamber 12 at temperatures above 400° C. in the chamber to prevent ignition of the chamber components. In an alternate embodiment, the vacuum pump 120 may also serve as one of the rough or fine vacuum pumps used in the vapor deposition system 10 for drawing and maintaining pressure in the vacuum chamber 12 under normal operating conditions, or for operation of the entry or exit vacuum lock stations, as discussed above with respect to FIG. 1.

Referring again to FIG. 2, it should be appreciated that the hot gas removed from the vacuum chamber 12 and conducted through the intake duct 102 will be extremely hot and, in this regard, it may be necessary to supply forced cooling to the intake duct 102. FIG. 2 diagrammatically illustrates a cooling jacket 122 configured with the duct 102. The cooling jacket 122 may be supplied with an external cooling medium 124, such as chilled water, or the like. It should be appreciated that other methods may be suitable for cooling the duct 102, such as a forced air system, and so forth.

FIG. 3 illustrates a unique embodiment wherein the cool-down system 100 is configured with the vapor deposition system 10 illustrated in FIG. 1. As discussed above with respect to FIG. 1, the vacuum chamber 12 may include a vapor deposition chamber 60, a plurality of pre-heat modules 16 disposed upstream of the vapor deposition chamber 60, and a plurality of cool-down modules 20 disposed downstream of the vapor deposition chamber 60 in a conveyance direction of the substrates 14. The supply duct 104 may be connected to one of the pre-heat modules 16, and the intake duct 102 may be connected to one of the cool-down modules 20. In the illustrated embodiment, the supply duct 104 may tap into the duct work associated with the fine vacuum pump 40. In an alternate embodiment, the supply duct 104 may tap directly into the module 16 via a dedicated line 105. As discussed above, an appropriate isolation valve 418 is provided in the duct 104.

In the embodiment of FIG. 3, the closed cool-down loop is thus defined by the plurality of modules between the supply duct 104 and intake duct 102, and the cool-down chamber 106. The re-circulating cooling gas is thus conveyed through the plurality of modules, including the vapor deposition chamber module 60, before being drawn off through the intake duct 102. The heated gas is cooled in the heat exchanger 106, with the heat being removed by the cooling medium 114. The blower 110 provides the motive force for the re-circulating cooling gas.

In the embodiment of FIG. 3, the cooling gas is supplied by the inert gas supply 112 via supply line 113 directly into the cool-down chamber 106. The vacuum pump 120 used to evacuate the chamber 106 and ducts 102, 104 is, in this embodiment, a rough vacuum pump that is also used in the exit vapor lock system discussed above with respect to FIG. 1. The rough vacuum pump is isolated from the cool-down system 100 by way of an appropriate isolation valve 518 during normal operating conditions of the vacuum chamber 12.

It should be appreciated that the cool-down rate achieved with the system 100 is dependent upon a number of variables, such as volume of the vacuum chamber 12, size and efficiency of the cool-down chamber 106, flow rate of the cooling medium, and so forth. A desirable cool-down rate for the system configuration of FIG. 3 is between about 200,000 BTU/hour to about 500,000 BTU/hour from an initial operating temperature of about 500 degrees C. within the vacuum chamber 12. In a particular embodiment, the cool-down chamber 106 has a design rating of about 500,000 BTU/hour, and the chamber 12 is cooled to about 300 degrees C. prior to being exposed to atmospheric conditions to prevent combustion of internal components.

The present invention also encompasses various methods for cool-down of a vacuum chamber in a vapor deposition system. These methods may be practiced with the system embodiments discussed above, or other appropriate system configurations not necessary depicted above or described herein. One embodiment of a suitable method calls for isolating a cool-down system from the vacuum chamber portion of the vapor deposition system. The cool-down system is first evacuated to remove oxygen therefrom. The system is then un-isolated and, thus, placed in fluid communication with the vacuum chamber to define a closed cool-down loop that includes the vacuum chamber. An inert gas, such as nitrogen, is introduced into the cool-down loop. This gas is then re-circulated through the vacuum chamber and a heat exchanger that is configured in-line in the cool-down loop. The re-circulating gas removes heat from the vacuum chamber, with the heat being removed from the cool-down loop via the heat exchanger.

A method embodiment may further include pressurizing the cool-down system with the inert gas to a pressure that is less than about 1 bar.

In another embodiment, the method may include evacuating the cool-down system with a dedicated vacuum pump, or a vacuum pump that is also used to draw or maintain a vacuum in the vapor deposition system.

The inert gas may be introduced into the vacuum chamber at any suitable location. For example, in one embodiment, the method involves introducing the inert gas into a component of the cool-down system, such as a cool-down chamber. In an alternate embodiment, the inert gas may be introduced into the vacuum chamber.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A system for vapor deposition of a thin film layer on photovoltaic (PV) module substrates, comprising:
    a vacuum chamber through which substrates are conveyed in a vapor deposition process wherein a source material is sublimated and deposited onto a surface of the substrates;
    said vacuum chamber further comprising:
        a vapor deposition chamber;
        an entry vacuum lock station, and an exit vacuum lock station;
        a conveyor configured for receipt and conveyance of individual PV module substrates through said entry vacuum lock station, said vapor deposition chamber, and said exit vacuum lock station;
        a feed device configured with said vapor deposition chamber to supply source material thereto;
        wherein said vapor deposition chamber further comprises a vapor deposition apparatus configured to sublimate the source material from said feed device and deposit the sublimated source material as a thin film layer onto the PV module substrates carried by said conveyor through said vapor deposition chamber; and
    a cool-down system configured with said vacuum chamber to recirculate a cooling gas through said vacuum chamber, said cool-down system including a heat exchanger external to said vacuum chamber through which the cooling gas recirculates in a closed cool-down loop, wherein said cool-down system further comprises:
        an intake duct connected at a first location to said vacuum chamber;

a supply duct connected at a second location to said vacuum chamber that is spaced from said first location;

a cool-down chamber external to said vacuum chamber, said intake duct and said supply duct connected to said cool-down chamber;

said heat exchanger disposed within said cool-down chamber;

a blower disposed within said cool-down chamber; and, an inert gas supply configured to introduce the cooling gas into said closed loop cool-down system;

wherein said cooling gas is drawn through said vacuum chamber, cooled in said cool-down chamber, and recirculated back through said vacuum chamber in the closed cool-down loop.

2. The system as in claim 1, further comprising a vacuum pump configured with said cool-down chamber.

3. The system as in claim 1, further comprising a cooling device configured with said intake duct.

4. The system as in claim 1, wherein said cool-down system further comprises isolation valves in said intake and supply ducts to isolate said cool-down chamber from said vacuum chamber.

5. The system as in claim 1, wherein said inert gas supply is disposed so as introduce the inert gas into said vacuum chamber.

6. The system as in claim 1, wherein said inert gas supply is disposed so as to introduce the inert gas into said cool-down chamber.

7. The system as in claim 1, wherein said vacuum chamber further comprises a plurality of pre-heat modules upstream of said deposition chamber in a conveyance direction of the substrates, and a plurality of cool-down modules downstream of said vapor deposition chamber in a conveyance direction of the substrates, said closed loop cooling system comprising a supply duct connected to one of said pre-heat modules and an intake duct connected to one of said cool-down modules.

8. The system as in claim 1, further comprising a vacuum pump configured with said cool-down chamber.

\* \* \* \* \*